(12) United States Patent
Drewes

(10) Patent No.: US 7,161,219 B2
(45) Date of Patent: Jan. 9, 2007

(54) MRAM DEVICES WITH FINE TUNED OFFSET

(75) Inventor: Joel A. Drewes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/050,797

(22) Filed: Feb. 7, 2005

(65) Prior Publication Data

US 2005/0158952 A1 Jul. 21, 2005

Related U.S. Application Data

(62) Division of application No. 10/404,146, filed on Apr. 2, 2003, now Pat. No. 6,885,073.

(51) Int. Cl.
*H01L 29/82* (2006.01)
*H01L 43/00* (2006.01)

(52) U.S. Cl. .......................... 257/421; 365/44

(58) Field of Classification Search ............... 257/421, 257/422, 428, 444; 365/44, 97, 98, 171, 365/173
See application file for complete search history.

(56) References Cited

U.S. PATENT DOCUMENTS

| 6,233,172 | B1 | 5/2001 | Chen et al. |
| 6,358,756 | B1 | 3/2002 | Sandhu et al. |
| 6,376,260 | B1 | 4/2002 | Chen et al. |
| 6,381,107 | B1 * | 4/2002 | Redon et al. ............ 360/324.2 |
| 6,392,922 | B1 | 5/2002 | Liu et al. |
| 6,418,048 | B1 | 7/2002 | Sin et al. |
| 6,667,861 | B1 * | 12/2003 | Gill ....................... 360/324.11 |
| 6,735,112 | B1 | 5/2004 | Zhu et al. |
| 6,751,074 | B1 | 6/2004 | Inomata et al. |
| 6,831,312 | B1 * | 12/2004 | Slaughter et al. ............ 257/295 |
| 7,031,119 | B1 * | 4/2006 | Watanabe et al. ........... 360/313 |
| 2004/0174740 | A1 * | 9/2004 | Lee et al. .................... 365/171 |

* cited by examiner

*Primary Examiner*—Phuc T. Dang
(74) *Attorney, Agent, or Firm*—Dickstein Shapiro LLP

(57) ABSTRACT

A MRAM cell structure is disclosed as containing an additional ferromagnetic layer and coupling layer between the third ferromagnetic layer and the anti-ferromagnetic layer. The additional ferromagnetic layer affects the demagnetization field to which the free layer is exposed, thereby reducing any bias introduced to the free layer. Further, by adjusting the thickness of the additional ferromagnetic layer, the effects of Neel coupling on the free layer are reduced.

10 Claims, 4 Drawing Sheets

MRAM DEVICES WITH FINE TUNED OFFSET

This application is a divisional of Application Ser. No. 10/404,146, filed Apr. 2, 2003 now U.S. Pat. No. 6,885,073, the entire disclosure of which is incorporated herein.

FIELD OF THE INVENTION

The present invention relates generally to magnetoresistive random access memory (MRAM) devices, and more particularly to a method for fine tuning offset in MRAM devices.

BACKGROUND OF THE INVENTION

A magnetoresistive random access memory (MRAM) cell generally contains a non-magnetic conductor forming a lower electrical contact, a free magnetic layer, a tunnel barrier layer, a pinned magnetic layer and a second non-magnetic conductor. The free magnetic layer, tunnel barrier layer and pinned magnetic layer collectively form a magnetic tunnel junction (MTJ) device.

Directions of magnetic orientations in the magnetic layers of the MRAM cell cause resistance variations. Magnetic orientation in one magnetic layer is magnetically fixed or pinned, while the magnetic orientation of the other magnetic layer is variable so that the magnetic orientation is free to switch direction.

In response to the shifting state of the free magnetic layer, the MRAM cell exhibits one of two different resistances or potentials which are read by the memory circuit as either a "1" or a "0." It is the creation and detection of these two distinct resistances or potentials that allows the memory circuit to read from and write information to an MRAM cell.

A bit of information may be written into the MTJ of an MRAM cell by applying orthogonal magnetic fields directed within the XY-plane of the MTJ. Depending on the strength of the magnetic fields, which are created by a current passing through the write line, the free magnetic layer's polarization may remain the same or switch direction. The free magnetic layer's polarization then may continue to be parallel to the pinned magnetic layer's polarization, or anti-parallel to the pinned magnetic layer's polarization.

The MTJ is in a state of low resistance if the overall orientation of magnetization in the free magnetic layer is parallel to the orientation of magnetization of the pinned magnetic layer. Conversely, the MTJ is in a state of high resistance if the overall orientation of magnetization in the free magnetic layer is anti-parallel to the orientation of magnetization in the pinned magnetic layer.

With reference to FIG. 1, a conventional MRAM cell structure 100 is depicted. The lowermost thin layer, or seed layer 102, is generally made up of tantalum (Ta). The next thin layer is ferromagnetic (FM) layer 104 which is the free layer. Free FM layer 104 is generally made up of a nickel iron (NiFe) alloy. As described above, it is free FM layer's 104 magnetic polarization that switches between being in a parallel state and an anti-parallel state with respect to the pinned layer(s) depending upon the strength of the magnetic field created by current passing through the write line of the memory circuit.

A tunnel barrier thin film layer 106 is shown on top of free FM layer 104. Tunnel barrier layer 106 is generally made up of aluminum oxide. A second pinned FM layer 108 is shown on top of barrier layer 106. Pinned FM layer 108 is typically formed of alloys of one or more of the following: Ni, Fe and cobalt (Co). A ruthenium (Ru) coupling layer 110 is formed on top of pinned FM layer 108 and couples the second pinned FM layer 108 with a third pinning FM layer 112. An anti-ferromagnetic layer 114 is then formed on top of the third pinning FM layer 112. Anti-ferromagnetic layer 114 is generally formed of iridium manganese (IrMn) or platinum manganese (PtMn).

In the MRAM cell 100 depicted in FIG. 1, the thickness of the second pinned FM layer 108 is represented by y and the thickness of the third pinning FM layer 112 is represented by x, where x and y can be equal or y could be thicker (where x and y are typically in the range of approximately 20–50 angstroms) for stability of the memory cell 100. The magnetization directions of the third pinning FM layer 112 and the second pinned FM layer 108 are anti-parallel. The relative thicknesses of the FM layers 108, 112 dictate which direction the magnetic material in the layers will be oriented. The third FM layer 112 is the pinned layer and the second FM layer 108 is the reference layer.

The anti-parallel status of the two FM layers 108, 112 is due to the Ruderman-Kittel-Kasuya-Yosida (RKKY) coupling of the reference layer 108. As depicted in FIG. 1, a portion of the demagnetization field from third FM layer 112 also passed through the free layer 104. The demagnetization field received from the third FM layer 112 creates an offset coupling effect at the free layer 104 that biases the orientation of the free layer in the same direction as the second pinned FM layer 108 and can affect the switching characteristics of the free layer 104 as well as increase the energy required to write a bit to the MRAM cell 100.

In addition, during fabrication of the MRAM cell 100 depicted in FIG. 1, the thin metal layers are typically formed by sputter deposition, evaporation or epitaxy techniques. When such methods are used, rather than being flat, the layers instead exhibit surface or interface waviness. This waviness of the surfaces and/or interfaces of the FM layers 104, 108, 112 is the cause of magnetic coupling between the free FM layer 104 and FM layer 108, which is known as topological coupling or Neel coupling. Just as the offset coupling described above, Neel coupling can affect the switching characteristics of the free layer 104 as well as increase the energy required to write a bit to the MRAM cell 100. Thus it is desirable to develop a MRAM cell having reduced offset coupling and reduced Neel coupling so as to alleviate the bias on the free layer.

BRIEF SUMMARY OF THE INVENTION

The present invention alleviates the above-described problems associated with offset coupling and Neel coupling by providing a MRAM cell structure containing an additional FM layer and coupling layer between the third FM layer and the anti-ferromagnetic layer. The additional FM layer can be used to adjust the demagnetization field to which the free layer is exposed, thereby reducing any offset coupling bias introduced to the free layer. Further, by adjusting the thickness of the additional FM layer, the effects of Neel coupling on the free layer are reduced.

BRIEF DESCRIPTION OF THE DRAWINGS

The above and other features and advantages of the invention will be more readily understood from the following detailed description of the invention which is provided in connection with the accompanying drawings.

DETAILED DESCRIPTION OF THE INVENTION

In the following detailed description, reference is made to the accompanying drawings which form a part hereof, and in which are shown by way of illustration specific embodiments in which the invention may be practiced. The embodiments are described in sufficient detail to enable those of ordinary skill in the art to make and use the invention, and it is to be understood that structural, logical or procedural changes may be made to the specific embodiments disclosed without departing from the spirit and scope of the present invention.

Figure 1:
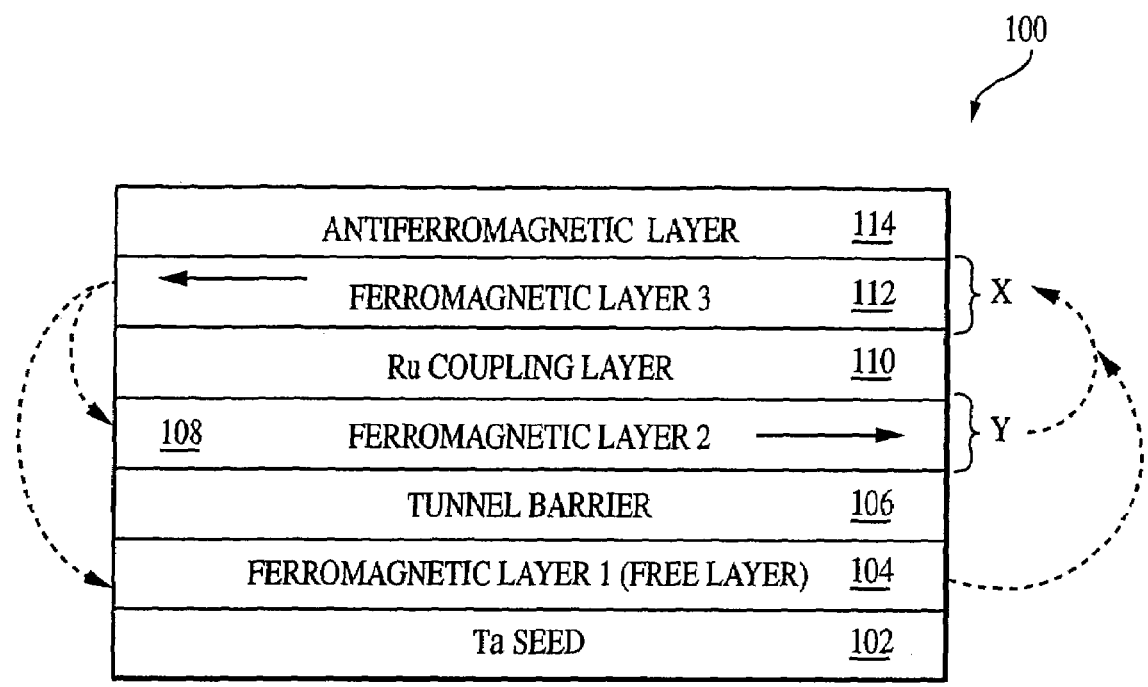
FIG. 1 depicts a conventional MRAM cell structure.
Figure 2:
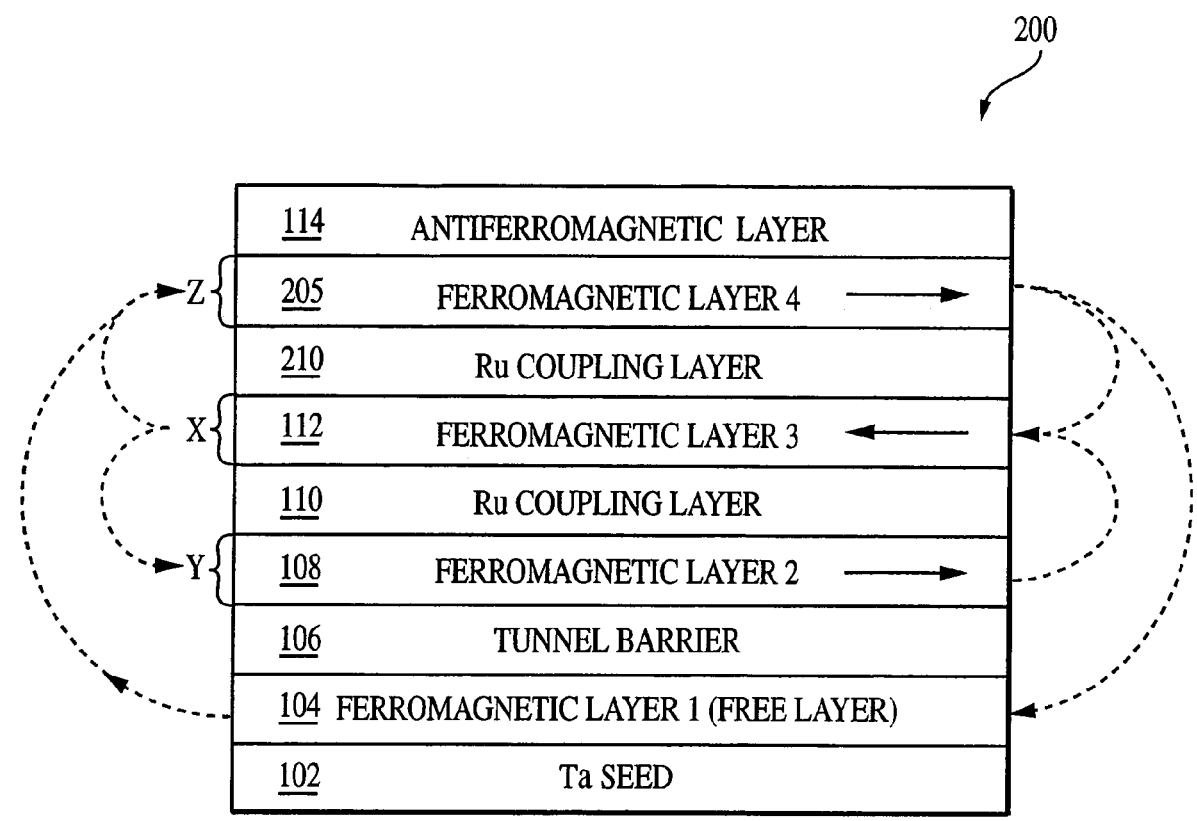
FIG. 2 depicts a MRAM cell structure in accordance with an exemplary embodiment of the invention.

FIG. 2 depicts a MRAM cell structure 200 in accordance with an exemplary embodiment of the invention. The cell structure 200 of FIG. 2 is similar to the cell structure 100 of FIG. 1 except that two additional layers are formed. The first additional layer is a Ru coupling layer 210 formed over the third FM pinning layer 112. The second additional layer is a fourth FM layer 205 formed on top of the Ru coupling layer 210. The thickness of the fourth FM layer 205 is represented by z, where z<y<x. The anti-ferromagnetic layer 114 is formed on top of the fourth FM layer 205.

The addition of the two layers serves to reduce the demagnetization field of the third FM layer 112 at the free FM layer 104. For example, whereas FIG. 1 depicts all of the demagnetization field of the third FM layer 112 being passed by the second FM layer 108 and the free FM layer 104, FIG. 2 depicts the demagnetization field of the third FM layer 112 as being split between the second FM layer 108 and the fourth FM layer 205. Thus, the offset coupling is greatly reduced and the bias that otherwise exists on the free FM layer 104 is substantially eliminated.

Further, by adjusting the thickness of the fourth FM layer 205, the demagnetization field passed by that layer 205 substantially cancels out the effects of Neel coupling between the free FM layer 104 and the second FM layer 108. For example, while Neel coupling between the free FM layer 104 and the second FM layer 108 provides a bias on the magnetization direction of the free layer to be equal to that of the second FM layer 108, as depicted in FIG. 2, a portion of the demagnetization field passing through the fourth FM layer 205 also passes through the free FM layer 104 in a direction opposite that of the second FM layer 108, thus the net bias on the free FM layer 104 can be substantially eliminated.

Figure 3:
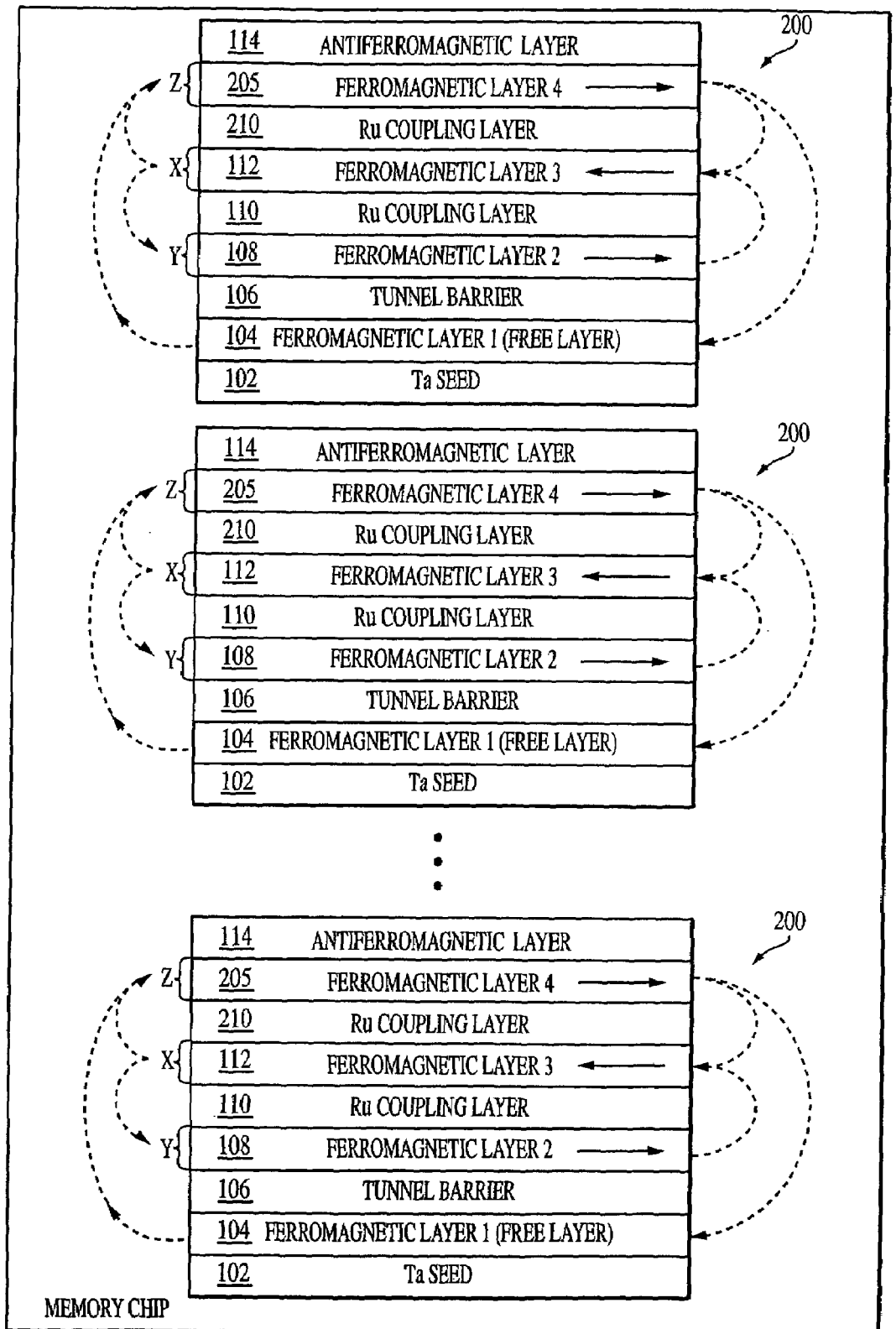
FIG. 3 depicts a memory with a plurality of MRAM cells having the FIG. 2 MRAM cell structure.

FIG. 3 depicts a memory (e.g., a semiconductor memory chip) that contains a plurality of MRAM cells 200 having the structure described above in connection with FIG. 2. The FIG. 3 memory chip may be included within the processor system 400 (of FIG. 4).

It is desirable to have a MRAM cell structure that has a substantially reduced offset coupling factor. The present invention accomplishes this by providing a cell structure with an additional FM layer 205 formed on top of the third FM layer 112. As illustrated, the demagnetization field of the third FM layer 112 is substantially shared between the second FM layer 108 and the fourth FM layer 205 so that the demagnetization field passed by the free FM layer 104 is substantially eliminated. Further, the effects of Neel coupling on the free FM layer 104 can be greatly reduced by adjusting the thickness of the fourth FM layer 205. Thus, the switching characteristics of the free FM layer 104 in the MRAM cell structure 200 are much more stable and less energy is required to write a bit of data to the MRAM cell 200.

Figure 4:
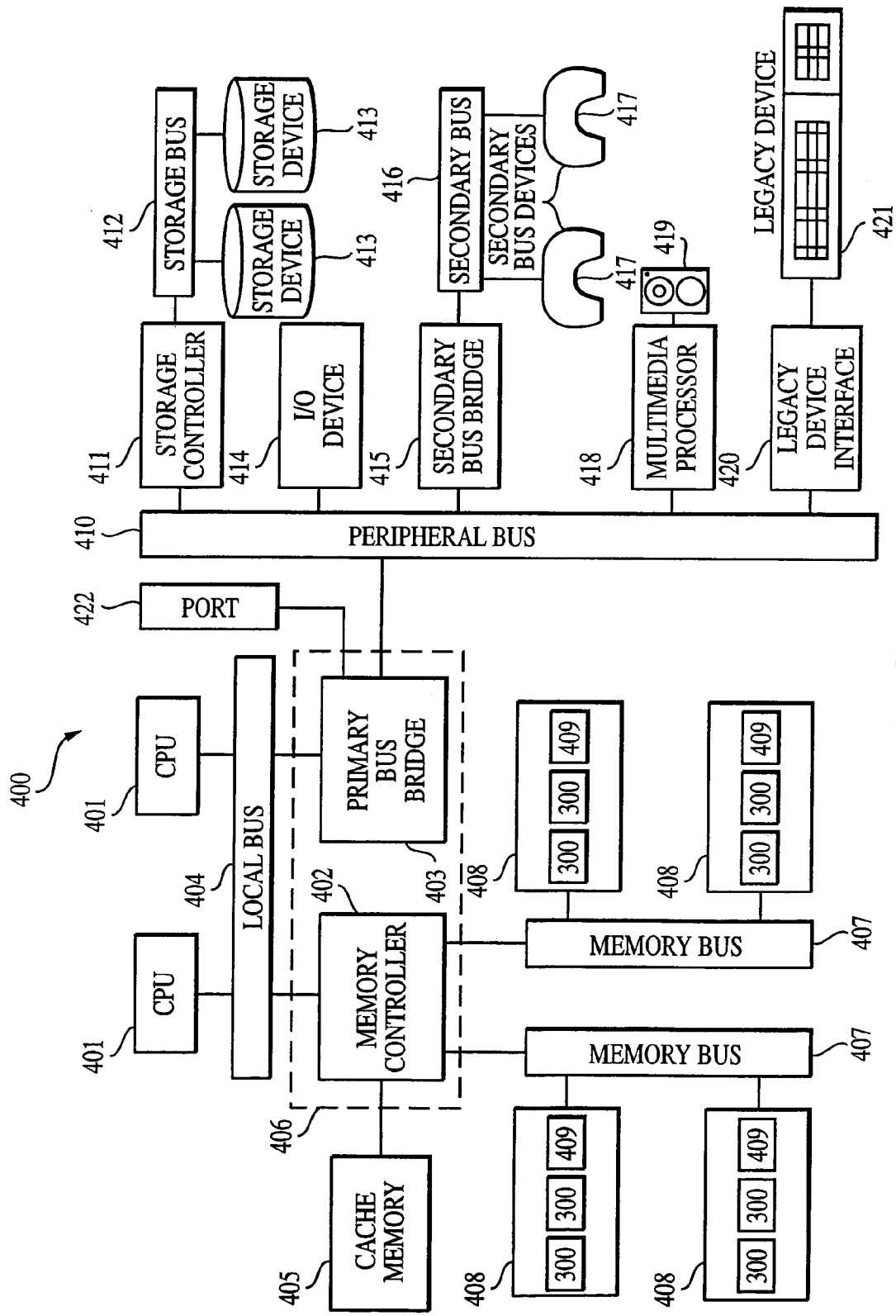
FIG. 4 depicts a processor system employing the FIG. 3 memory.

FIG. 4 illustrates an exemplary processing system 400 employing a memory chip such as memory chip 300 (of FIG. 3) of the present invention. The processing system 400 includes one or more processors 401 coupled to a local bus 404. A memory controller 402 and a primary bus bridge 403 are also coupled the local bus 404. The processing system 400 may include multiple memory controllers 402 and/or multiple primary bus bridges 403. The memory controller 402 and the primary bus bridge 403 may be integrated as a single device 406.

The memory controller 402 is also coupled to one or more memory buses 407. Each memory bus accepts memory components 408 which include at least one memory device 300 having the MRAM cell structure 200 described in connection with FIG. 2. The memory components 408 may be a memory card or a memory module. Examples of memory modules include single inline memory modules (SIMMs) and dual inline memory modules (DIMMs). The memory components 408 may include one or more additional devices 409. For example, in a SIMM or DIMM, the additional device 409 might be a configuration memory, such as a serial presence detect (SPD) memory. The memory controller 402 may also be coupled to a cache memory 405. The cache memory 405 may be the only cache memory in the processing system. Alternatively, other devices, for example, processors 401 may also include cache memories, which may form a cache hierarchy with cache memory 405. If the processing system 400 includes peripherals or controllers which are bus masters or which support direct memory access (DMA), the memory controller 402 may implement a cache coherency protocol. If the memory controller 402 is coupled to a plurality of memory buses 407, each memory bus 407 may be operated in parallel, or different address ranges may be mapped to different memory buses 407.

The primary bus bridge 403 is coupled to at least one peripheral bus 410. Various devices, such as peripherals or additional bus bridges may be coupled to the peripheral bus 410. These devices may include a storage controller 411, a miscellaneous I/O device 414, a secondary bus bridge 415 communicating with a secondary bus 416, a multimedia processor 418, and a legacy device interface 420. The primary bus bridge 403 may also be coupled to one or more special purpose high speed ports 422. In a personal computer, for example, the special purpose port might be the Accelerated Graphics Port (AGP), used to couple a high performance video card to the processing system 400.

The storage controller 411 couples one or more storage devices 413, via a storage bus 412, to the peripheral bus 410. For example, the storage controller 411 may be a SCSI controller and storage devices 413 may be SCSI discs. The I/O device 414 may be any sort of peripheral. For example, the I/O device 414 may be a local area network interface, such as an Ethernet card. The secondary bus bridge 415 may be used to interface additional devices via another bus to the processing system. For example, the secondary bus bridge may be a universal serial port (USB) controller used to couple USB devices 417 to the processing system 400. The multimedia processor 418 may be a sound card, a video capture card, or any other type of media interface, which may also be coupled to additional devices such as speakers 419. The legacy device interface 420 is used to couple at least one legacy device 421, for example, older styled keyboards and mice, to the processing system 400.

The processing system 400 illustrated in FIG. 4 is only an exemplary processing system with which the invention may be used. While FIG. 4 illustrates a processing architecture especially suitable for a general purpose computer, such as a personal computer or a workstation, it should be recognized that well known modifications can be made to configure the processing system 400 to become more suitable for use in a variety of applications. For example, many electronic devices which require processing may be implemented using a simpler architecture which relies on a CPU 401 coupled to memory components 408 and/or memory devices having the MRAM cell structure 200 described above in connection with FIG. 2. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although the invention has been described in connection with a specific ordering of the MJT device layers, the invention may be practiced with the opposite ordering of the layers as well without departing from the spirit and scope of the invention. In addition, although the invention is described in connection with specific materials used for the metal layers, it should be readily apparent that other materials may be substituted for those specifically mentioned. Accordingly, the invention is not limited by the foregoing description or drawings, but is only limited by the scope of the appended claims.

What is claimed is:

1. A magnetoresistive random access memory (MRAM) cell, comprising:
    a first ferromagnetic layer;
    a barrier layer formed over said first ferromagnetic layer;
    a second ferromagnetic layer formed over said barrier layer;
    a first coupling layer formed over said second ferromagnetic layer;
    a third ferromagnetic layer formed over said first coupling layer;
    a second coupling layer formed over said third ferromagnetic layer;
    a fourth ferromagnetic layer formed over said second coupling layer; and
    an anti-ferromagnetic layer formed over said fourth ferromagnetic layer.

2. A memory, comprising:
    a plurality of magnetoresistive random access memory (MRAM) cells, each of said MRAM cells comprising:
    a first ferromagnetic layer;
    a barrier layer formed over said first ferromagnetic layer;
    a second ferromagnetic layer formed over said barrier layer;
    a first coupling layer formed over said second ferromagnetic layer;
    a third ferromagnetic layer formed over said first coupling layer;
    a second coupling layer formed over said third ferromagnetic layer;
    a fourth ferromagnetic layer formed over said second coupling layer; and
    an anti-ferromagnetic layer formed over said fourth ferromagnetic layer.

3. A processor system, comprising:
    a processor; and
    a memory coupled to said processor, said memory containing a plurality of magnetoresistive random access memory (MRAM) cells, each of said MRAM cells comprising:
    a first ferromagnetic layer;
    a barrier layer formed over said first ferromagnetic layer;
    a second ferromagnetic layer formed over said barrier layer;
    a first coupling layer formed over said second ferromagnetic layer;
    a third ferromagnetic layer formed over said first coupling layer;
    a second coupling layer formed over said third ferromagnetic layer;
    a fourth ferromagnetic layer formed over said second coupling layer; and
    an anti-ferromagnetic layer formed over said fourth ferromagnetic layer.

4. A layered structure, comprising:
    a plurality of layers of ferromagnetic material spaced apart by respective spacer layers, wherein
    a demagnetization field of a first ferromagnetic layer is substantially absent from at least a second layer of said plurality of ferromagnetic layers when said layered structure is in the presence of a magnetic field.

5. The MRAM cell of claim 1, further comprising:
    a seed layer formed below said first ferromagnetic layer.

6. The MRAM cell of claim 5, wherein said seed layer is formed of tantalum.

7. The MRAM cell of claim 1, wherein said anti-ferromagnetic layer is formed of iridium manganese.

8. The MRAM cell of claim 1, wherein said anti-ferromagnetic layer is formed of platinum manganese.

9. The MRAM cell of claim 1, wherein said first and second coupling layers comprise ruthenium.

10. The MRAM cell of claim 1, wherein said barrier layer comprises aluminum oxide.

* * * * *